United States Patent
Yamanishi et al.

(10) Patent No.: US 8,668,994 B2
(45) Date of Patent: *Mar. 11, 2014

(54) ROLLED COPPER FOIL OR ELECTROLYTIC COPPER FOIL FOR ELECTRONIC CIRCUIT, AND METHOD OF FORMING ELECTRONIC CIRCUIT USING SAME

(75) Inventors: Keisuke Yamanishi, Ibaraki (JP); Kengo Kaminaga, Ibaraki (JP); Ryo Fukuchi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 172 days.

This patent is subject to a terminal disclaimer.

(21) Appl. No.: 13/142,002

(22) PCT Filed: Dec. 22, 2009

(86) PCT No.: PCT/JP2009/071293
§ 371 (c)(1),
(2), (4) Date: Jun. 29, 2011

(87) PCT Pub. No.: WO2010/074061
PCT Pub. Date: Jul. 1, 2010

(65) Prior Publication Data
US 2011/0297641 A1 Dec. 8, 2011

(30) Foreign Application Priority Data
Dec. 26, 2008 (JP) .................................. 2008-334343

(51) Int. Cl.
*B32B 15/20* (2006.01)
(52) U.S. Cl.
USPC ........ 428/671; 428/209; 428/472.1; 428/469; 428/615; 428/618; 428/621; 428/658; 428/668; 428/675

(58) Field of Classification Search
USPC ........ 428/469, 472.1, 472.2, 472.3, 618, 621, 428/209, 615, 658, 668, 671, 675
See application file for complete search history.

(56) References Cited

U.S. PATENT DOCUMENTS 4,503,112 A * 3/1985 Konicek ......................... 428/216
5,366,814 A * 11/1994 Yamanishi et al. ............ 428/607
(Continued)

FOREIGN PATENT DOCUMENTS

EP 1006763 A2 * 6/2000
JP 06-081172 A 3/1994
(Continued)

*Primary Examiner* — Cathy Lam
(74) *Attorney, Agent, or Firm* — Howson & Howson LLP

(57) ABSTRACT

Provided is a rolled copper foil or electrolytic copper foil for an electronic circuit to be used for forming a circuit by etching, wherein the copper foil comprises a nickel or nickel alloy layer with a lower etching rate than copper formed on an etching side of the rolled copper foil or electrolytic copper foil, and a heat resistance layer composed of zinc or zinc alloy or its oxide formed on the nickel or nickel alloy layer. This invention aims to prevent sagging caused by the etching, to form a uniform circuit having the intended circuit width, and to shorten the time of forming a circuit by etching as much as possible, when forming a circuit by etching a copper foil of the copper-clad laminate; and also aims to make the thickness of the nickel or nickel alloy layer as thin as possible, to inhibit oxidation when exposed to heat, to prevent tarnish (discoloration) known as "YAKE", to improve the etching properties in pattern etching, and to prevent the occurrence of short circuits and defects in the circuit width.

19 Claims, 1 Drawing Sheet

(56) References Cited

U.S. PATENT DOCUMENTS

| | | | |
|---|---|---|---|
| 5,389,446 A * | 2/1995 | Yamanishi et al. | 428/472 |
| 5,456,817 A | 10/1995 | Hino et al. | |
| 5,552,234 A | 9/1996 | Kawasumi | |
| 5,567,534 A | 10/1996 | Yano et al. | |
| 5,700,362 A | 12/1997 | Yano et al. | |
| 5,919,379 A * | 7/1999 | Thorpe | 216/13 |
| 6,989,199 B2 * | 1/2006 | Yamamoto et al. | 428/607 |
| 7,026,059 B2 * | 4/2006 | Suzuki et al. | 428/626 |
| 7,060,364 B2 * | 6/2006 | Kataoka et al. | 428/615 |
| 7,691,487 B2 * | 4/2010 | Nagatani | 428/607 |
| 8,142,905 B2 * | 3/2012 | Moriyama et al. | 428/626 |
| 8,357,307 B2 | 1/2013 | Yamanishi et al. | |
| 2004/0154930 A1 | 8/2004 | Shinozaki | |
| 2007/0237976 A1 | 10/2007 | Okada et al. | |
| 2009/0162685 A1 | 6/2009 | Kobayashi et al. | |
| 2010/0040873 A1 | 2/2010 | Kohiki et al. | |
| 2010/0212941 A1 | 8/2010 | Higuchi | |
| 2011/0259848 A1 | 10/2011 | Yamanishi et al. | |
| 2011/0284496 A1 | 11/2011 | Yamanishi et al. | |
| 2011/0293960 A1 | 12/2011 | Yamanishi et al. | |
| 2011/0300401 A1 | 12/2011 | Yamanishi et al. | |
| 2012/0135266 A1 | 5/2012 | Kaminaga | |
| 2012/0276412 A1 | 11/2012 | Miki | |
| 2012/0318568 A1 | 12/2012 | Yamanishi et al. | |
| 2013/0001186 A1 | 1/2013 | Sakaguchi et al. | |

FOREIGN PATENT DOCUMENTS

| | | |
|---|---|---|
| JP | 06-085416 A | 3/1994 |
| JP | 06-085417 A | 3/1994 |
| JP | 2002-176242 A | 6/2002 |
| JP | 2005-015861 A | 1/2005 |
| JP | 2005-039097 A | 2/2005 |
| JP | 2006-261270 A | 9/2006 |
| WO | 02/35897 A1 | 5/2002 |

* cited by examiner $$EF = \frac{b}{a}$$

ROLLED COPPER FOIL OR ELECTROLYTIC COPPER FOIL FOR ELECTRONIC CIRCUIT, AND METHOD OF FORMING ELECTRONIC CIRCUIT USING SAME

BACKGROUND OF THE INVENTION

The present invention relates to a rolled copper foil or electrolytic copper foil for an electronic circuit to be used for forming a circuit by etching, and to a method of forming an electronic circuit by using such rolled copper foil or electrolytic copper foil.

A copper foil for a printed circuit is being widely used in electronic devices and electrical equipment. This kind of copper foil for a printed circuit is generally bonded to a base material such as a synthetic resin board or a film with an adhesive or without using an adhesive under high temperature and pressure to produce a copper-clad laminate, a circuit is subsequently printed with the process steps of resist coating and exposure in order to form the intended circuit, etching treatment is further performed in order to remove any unwanted part of the copper foil, and the various elements are soldered thereto in order to form a printed circuit for electronic devices.

A copper foil that is used for such a printed circuit can be broadly classified as an electrolytic copper foil and a rolled copper foil depending on the production method, but both are used according to the type or quality demand of the printed circuit board.

These copper foils have a surface that is bonded to a resin base material and a non-bonding surface, and they are respectively subject to special surface treatment (treatment process). In addition, there are cases where both surfaces are provided with a function of bonding with the resin (double treatment process); for instance, such as with a copper foil that is used as the inner layer of a multi-layered printed wiring board.

An electrolytic copper foil is generally produced by electrodepositing copper on a rotating drum, and continuously peeling this to obtain a copper foil. At this point in the production process, the surface in contact with the rotating drum is a gloss surface, and the opposite surface has numerous asperities (rough surface). Nevertheless, even with this kind of rough surface, it is standard to adhere copper particles of approximately 0.2 to 3 µm in order to further improve the adhesiveness with the resin substrate.

Moreover, there are also cases of reinforcing the foregoing asperities and forming a thin plated layer thereon for preventing the falling of the copper particles. The foregoing series of steps is referred to as roughening treatment. This kind of roughening treatment is required not only for electrolytic copper foils, but also required for rolled copper foils, and similar roughening treatment is also performed for rolled copper foils.

The foregoing copper foils are used and subject to hot pressing process or Roll-to-Roll process to produce a copper-clad laminate. To cite hot pressing process as an example, this laminate is produced through the process steps of synthesizing epoxy resin, impregnating a paper base material with phenol resin and drying this to produce a prepreg, and subjecting the prepreg and the copper foil, which are combined, to heat pressure molding with a pressing machine. In addition to the above, there is a method of drying a polyimide precursor solution on the copper foil to solidify this onto the copper foil in order to form a polyimide resin layer on the copper foil.

With the copper-clad laminate produced as described above, a circuit is printed with the process steps of resist coating and exposure, and etching treatment is further performed to remove any unwanted part of the copper foil. However, when forming a circuit by etching, there is a problem in that the circuit does not have the intended circuit width.

This is because the copper portion of the copper foil circuit after etching is etched downward from the surface of the copper foil; that is, etched broader toward the resin layer (cause sagging). If large "sagging" occurs, the copper circuit will short in the vicinity of the resin substrate, and may become defective.

It is necessary to reduce such "sagging" as much as possible. Thus, in order to prevent defective etching such as etching broadened downward, attempts have been made to reduce the "sagging" by prolonging the etching time and increasing the etching process.

Nevertheless, in the foregoing case, if there is a portion that has already reached a predetermined width dimension, such portion will be additionally etched, and the circuit width of that copper foil portion will correspondingly become narrower, and the uniform line width (circuit width) that is intended in the circuit design cannot be obtained. In particular, there is a problem in that such portion (thinned portion) will generate heat and, in certain cases, become disconnected.

Under circumstances where the patterns of electronic circuits are becoming finer, problems caused by this kind of defective etching are still often encountered today, and are becoming major issues in forming circuits.

In order to overcome the foregoing problems, the present inventors proposed a copper foil in which a metal or alloy layer to be etched slower than copper was formed on the copper foil on the etching side (refer to Patent Document 1). As the metal or alloy in this case, used are nickel, cobalt and their alloys.

Upon designing a circuit, since the etching solution will infiltrate from the resist coated side, namely, from the surface of the copper foil, if there is a metal or alloy layer with a slow etching rate immediately below the resist, the etching of the portion of the copper foil in the vicinity thereof is inhibited, and the etching of the other portions of the copper foil will advance. Thus, it was possible to yield the effect of reducing the "sagging" and forming a circuit with a uniform line width. Consequently, there was a vast improvement in comparison to the conventional technology.

Here, some problems arose at the stage of making further improvements. Specifically, after forming the circuit, it was necessary to remove the resin and also necessary to remove the metal or alloy layer with a slow etching rate, which was formed for preventing the "sagging", by soft etching. In addition, it was also necessary to perform high-temperature treatment to the copper foil in the steps such that the resin is attached during the process of forming an electronic circuit with the use of a copper foil having a metal or alloy layer (nickel or nickel alloy layer) with a slow etching rate as a copper-clad laminate.

With respect to the former, in order to shorten the time required for the etching and removal process and achieve a clean removal, it is necessary to make the thickness of the nickel or nickel alloy layer as thin as possible. With respect to the latter, since it is exposed to heat, the nickel or nickel alloy layer is oxidized (commonly called "YAKE (oxidation)" since tarnish occurs), and there are problems in that the etching properties may deteriorate in the pattern etching, and defects such as short circuits or deterioration in the controllability of the circuit width may occur due to the deterioration in the resist coating properties (uniformity, adhesion) or the excessive etching of the interfacial oxide during the etching process. Thus, it is demanded that additional improvements be made, or different materials be used as a substitute therefor.

Here, there are several inventions that if the copper foil is to be exposed to heat, a zinc or zinc alloy or the like is formed on a gloss surface of the copper foil for a printed circuit for inhibiting the thermal oxidation resistance. For example, these would be Patent Document 2, Patent Document 3, Patent Document 4, Patent Document 5, Patent Document 6, and Patent Document 7. Moreover, also proposed is a method of covering the side to be bonded with the resin, or the side not to be etched, with nickel or nickel alloy.

Nevertheless, since these technologies were not proposed to prevent or inhibit the etching portion of the copper foil from being etched broader from the surface of the copper foil downward (occurrence of sagging) upon designing a copper foil circuit through etching, they are unable to resolve the foregoing problems.

Patent Document 1: Japanese Laid-Open Patent Publication No. 2002-176242
Patent Document 2: Japanese Laid-Open Patent Publication No. H5-140765
Patent Document 3: Japanese Laid-Open Patent Publication No. H6-85416
Patent Document 4: Japanese Laid-Open Patent Publication No. H6-85417
Patent Document 5: Japanese Laid-Open Patent Publication No. H6-280047
Patent Document 6: Japanese Laid-Open Patent Publication No. H7-74464
Patent Document 7: Japanese Laid-Open Patent Publication No. H7-278883
Patent Document 8: Japanese Laid-Open Patent Publication No. 2005-15861
Patent Document 9: Japanese Laid-Open Patent Publication No. 2006-261270

SUMMARY OF THE INVENTION

An object of this invention is to obtain a rolled copper foil or electrolytic copper foil for an electronic circuit, wherein, upon forming a circuit by etching a copper foil of a copper-clad laminate, sagging caused by the etching is prevented, a uniform circuit having an intended circuit width can be formed, and the time of forming a circuit by etching is shortened, and wherein the thickness of a nickel or nickel alloy layer is reduced as much as possible, the removal by soft etching can be facilitated, the dissolution residue of the coating layer after being etched is prevented, oxidation is inhibited when exposed to heat, tarnish (discoloration) known as "YAKE" is prevented, the etching properties in pattern etching are improved, and the occurrence of short circuits and defects in the circuit width are prevented; and to obtain the method of forming an electronic circuit using such copper foils.

The present inventors discovered that, by forming a plurality of layers on the etching surface of a rolled copper foil or an electrolytic copper foil and adjusting the etching rate in the thickness direction of the copper foil, it is possible to form a circuit with a uniform circuit width without any sagging, prevent oxidation when exposed to heat in order to prevent tarnish known as "YAKE", and simultaneously resolve several other problems upon designing an electronic circuit.

Based on the foregoing discovery, the present invention provides:
1. A rolled copper foil or electrolytic copper foil for an electronic circuit, wherein the rolled copper foil or electrolytic copper foil to be used for forming a circuit by etching comprises a nickel or nickel alloy layer (A) with a lower etching rate than copper formed on an etching side of the rolled copper foil or electrolytic copper foil, and a heat resistance layer (B) composed of zinc or zinc alloy or its oxide formed on the nickel or nickel alloy layer (A);
2. The rolled copper foil or electrolytic copper foil for an electronic circuit according to 1 above, wherein the heat resistance layer (B) is a layer composed of zinc or zinc alloy, and the zinc alloy contains, as an alloy element, at least one or more types selected from nickel, cobalt and chromium; and
3. The rolled copper foil or electrolytic copper foil for an electronic circuit according to 1 or 2 above, wherein if the alloy with a lower etching rate than copper is nickel alloy, the nickel ratio in the nickel alloy layer (A) exceeds 50 wt %.

The present invention further provides:
4. The rolled copper foil or electrolytic copper foil for an electronic circuit according to any one of 1 to 3 above, wherein if the alloy with a lower etching rate than copper is nickel alloy, the alloy component contained in the nickel alloy is either zinc or cobalt; and
5. The rolled copper foil or electrolytic copper foil for an electronic circuit according to any one of 1 to 4 above, wherein the total amount of zinc contained in the heat resistance layer (B) and the nickel alloy layer (A) is 30 µg/dm$^2$ to 1000 µg/dm$^2$ based on metal zinc conversion and does not exceed the total amount of nickel.

The present invention additionally provides:
6. The rolled copper foil or electrolytic copper foil for an electronic circuit according to any one of 1 to 5 above, wherein the amount of nickel contained in the nickel or nickel alloy layer (A) is 100 µg/dm$^2$ to 3000 µg/dm$^2$; and
7. The rolled copper foil or electrolytic copper foil for an electronic circuit according to any one of 1 to 6 above, wherein the copper foil further comprises a chromium layer or a chromate layer and/or a silane-treated layer on the heat resistance layer (B).

The present invention additionally provides:
8. The rolled copper foil or electrolytic copper foil for an electronic circuit according to 7 above, wherein the amount of chromium in the case of comprising the chromium layer or chromate layer is 100 µg/dm$^2$ or less based on metal chromium conversion; and
9. The rolled copper foil or electrolytic copper foil for an electronic circuit according to 7 above, wherein the amount of silane in the case of comprising the silane-treated layer is 20 µg/dm$^2$ or less based on silicon elemental conversion.

The present invention additionally provides:
10. A method of forming an electronic circuit, the method of forming an electronic circuit by etching a copper foil of a copper-clad laminate comprising a rolled copper foil or electrolytic copper foil, wherein a layer of nickel or nickel alloy (A), which is a metal or alloy with a lower etching rate than copper, is formed on the etching side of the copper foil, a heat resistance layer (B) composed of zinc or zinc alloy or its oxide is formed on the nickel or nickel alloy layer (A), and thereafter the copper foil is subject to etching with an aqueous ferric chloride or an aqueous copper chloride to remove any unwanted portion of the copper and thereby form a copper circuit.

The present invention additionally provides:
11. A method of forming an electronic circuit, the method of forming an electronic circuit by etching a copper foil of a copper-clad laminate comprising a rolled copper foil or electrolytic copper foil, wherein the rolled copper foil or electrolytic copper foil for an electronic circuit according to any one of 1 to 9 above is subject to etching with an aqueous ferric chloride or an aqueous copper chloride to remove any unwanted portion of the copper and thereby form a copper circuit.

The present invention yields the effect of being able to form a more uniform circuit having an intended circuit width upon forming a circuit by etching a copper foil of a copper-clad laminate. The present invention yields the additional effects of being able to prevent sagging caused by the etching, shorten the time of forming a circuit by etching, make the thickness of the nickel or nickel alloy layer as thin as possible, facilitate the removal by soft etching, prevent the dissolution residue of the coating layer after etching, inhibit oxidation when exposed to heat, and prevent tarnish known as "YAKE".

It is thereby possible to provide a rolled copper foil or electrolytic copper foil for an electronic circuit capable of improving the etching properties in pattern etching and preventing the occurrence of short circuits and defects in the circuit width, and further provide a method of forming a superior electronic circuit.

DETAILED DESCRIPTION OF THE INVENTION

Figure 1:
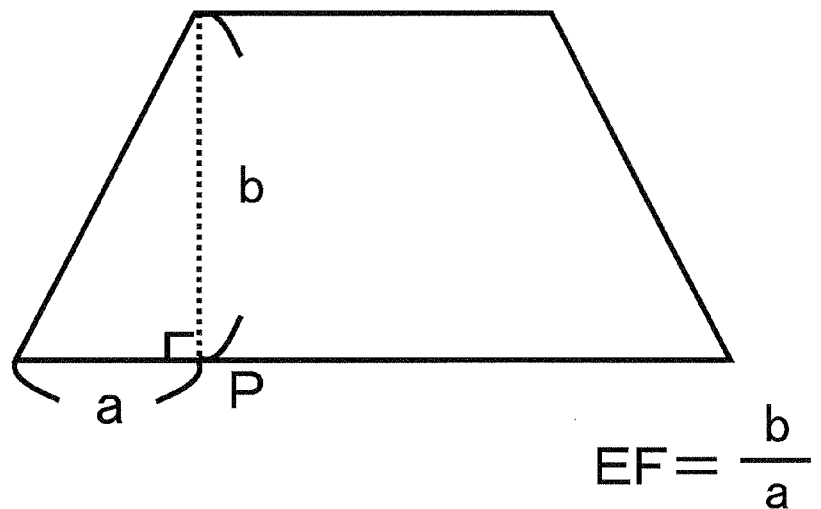
FIG. 1 A diagram explaining the outline of the calculation method of the etching factor (EF).

The rolled copper foil or electrolytic copper foil for an electronic circuit to be used for forming a circuit by etching according to the present invention comprises a layer of nickel or nickel alloy, which is a metal or an alloy with a lower etching rate than copper, formed on an etching side of the rolled copper foil or electrolytic copper foil; and a heat resistance layer composed of zinc or zinc alloy or its oxide formed on the nickel or nickel alloy layer.

The foregoing rolled copper foil or electrolytic copper foil is bonded with resin to form a copper-clad laminate. Both an electrolytic copper foil and a rolled copper foil can be applied as this copper foil. Moreover, any of a roughened surface (M surface) and a gloss surface (S surface) is applicable. The gloss surface side is usually used. A rolled copper foil includes high-purity copper foils and copper alloy foils with improved strength, and the present invention covers all of these copper foils.

The nickel or nickel alloy which inhibits etching is positioned near the resist portion on the copper foil, and the etching rate of the copper foil on the resist side is restrained due to the nickel or nickel alloy layer, and conversely, the etching of copper proceeds at a normal rate with distance from the nickel or nickel alloy layer. Consequently, etching will proceed almost vertically from the resist side of the side surface of the copper circuit toward the resin substrate side, and a rectangular copper foil circuit is formed.

As described above, since the etching solution will infiltrate from the resist coated side, namely from the surface of the copper foil, upon etching the circuit; if a zinc or zinc alloy layer is formed on the copper foil, it will not have functions that are equal to nickel or nickel alloy. Rather, since a zinc or zinc alloy layer is easily etched when designing a circuit, based on common general technical knowledge, it is considered that a zinc or zinc alloy layer would increase "sagging" and impair the design of circuit with a uniform line width.

Nevertheless, it has been confirmed that it is possible to unexpectedly prevent "YAKE" and form a uniform circuit having the intended circuit width by forming a zinc or zinc alloy layer on a nickel or nickel alloy layer, that is a metal or alloy with a slow etching rate, formed on the copper foil, namely by using a combination of the both layers. The effect that is yielded here is extremely significant.

It is necessary for the copper-clad laminate to be subject to high-temperature treatment upon attaching the resin in the process of forming an electronic circuit. In the foregoing case, the nickel or nickel alloy layer is oxidized, and the resist coating properties (uniformity, adhesion) often deteriorate. Moreover, during the etching process, the interfacial oxides formed at the time of heating often lead to variation in the etching, and cause a short circuit or non-uniformity of the circuit width.

Patent Document 9 proposes a manufacturing process of a copper-clad laminate for controlling the oxygen concentration, and it is considered that oxidation resistance against high-temperature treatment will be demanded more strongly in the future.

Here, since the zinc or zinc alloy layer that is formed on the copper foil and the nickel or nickel alloy layer is a material with thermal oxidation resistance, the mere thin coating of the zinc or zinc alloy layer will yield the effect of considerably improving the thermal oxidation resistance and tarnish prevention.

As a result of forming a thick nickel or nickel alloy layer, it is possible to prevent the influence of thermal oxidation, but such thick formation is in itself a problem. In other words, since it needs to be removed after etching, much time will be required for the removal process.

However, as a result of forming a thin zinc or zinc alloy layer, it was possible to yield a greater effect of being able to alleviate the thickness of the nickel or nickel alloy layer. It is thereby possible to facilitate the removal of the nickel or nickel alloy layer by soft etching.

Accordingly, nickel or nickel alloy is especially effective as a metal layer with a lower etching rate than copper. With an etching solution (aqueous copper chloride, aqueous ferric chloride or the like) that is generally used for forming an electronic circuit pattern on the copper-clad laminate, so as long as it is an alloy having nickel as its primary component, it will be effective in improving the etching factor since the etching rate will be the same level as nickel, or sufficiently lower than copper even if it is greater than nickel.

As described above, since zinc is a metal that is easily etched, it must be reduced from a quantitative standpoint. In the present invention, since the main object is to achieve a uniform etched width of the circuit and to prevent "sagging", the amount of metals such as zinc that are easily corroded must be kept low. Nickel alloy is used in this respect, and nickel must be the primary component.

Incidentally, with respect to a way to spot the bilayer configured from a metal layer (A) with a low etching rate and a heat resistance layer (B), it is difficult to clearly spot the layer structure since the surface treatment of the copper foil is extremely thin, but as one example, a way to distinguish between the metal or alloy layer (A) with a slower etching rate than copper and the heat resistance layer (B) is shown below.
(Apparatus) AXIS-HS manufactured by Kratos
    Argon sputtering conditions: accelerating voltage of 15 kV, emission current of 10 mA
    Sputter rate: Approximately 3 nm/min with silicon oxide
    Measuring frequency: 2 points/min
(Determination) Since the peak positions in the at % of nickel, zinc, elements contained in the alloy layer (A) with a low etching rate, and elements contained in the heat resistant layer (B) are different, it is possible to comprehensively confirm that it is a bilayer.

In this measurement, the at % of the metal or alloy layer (A) with a low etching rate is confirmed and converted into wt % in order to calculate the nickel ratio and confirm whether the nickel ratio exceeds 50 wt %.

Accordingly, as the alloy component contained in the nickel alloy as the alloy with a slower etching rate than the rolled copper foil or electrolytic copper foil for an electronic circuit, any well-known alloy component may be used. For example, an alloy of nickel and at least one or more types selected from zinc, phosphorus, boron, molybdenum, tungsten and cobalt has an etching rate that is slower than copper, and is effective in improving the etching factor.

Particularly preferable is an alloy with zinc. Here, the zinc contained in the nickel alloy is not limited to metal zinc, and also includes zinc hydroxide and zinc oxide.

Moreover, it is preferable that the heat resistance layer is zinc or zinc alloy, and the zinc alloy contains, as an alloy element, one or two types selected from nickel and cobalt.

A chromium layer or a chromate layer and/or a silane-treated layer may be additionally formed on the nickel or nickel alloy layer. Here, although there may be a difference in the etching rate relative to the pattern etching solution, as a result of adequately selecting their amounts, it is possible to inhibit the oxidation of the nickel or nickel alloy surface, and a pattern with a stable circuit width can thereby be formed.

Preferably, the total amount of zinc contained in the heat resistance layer and the nickel alloy layer of the rolled copper foil or electrolytic copper foil for an electronic circuit according to the present invention is 30 $\mu g/dm^2$ to 1000 $\mu g/dm^2$ based on metal zinc conversion and does not exceed the total amount of nickel.

If it is less than 30 $\mu g/dm^2$, there is no oxidation resistance (inhibition of YAKE) effect. Moreover, if it exceeds 1000 $\mu g/dm^2$, the effect becomes saturated and the effect of the nickel or nickel alloy is offset. In addition, if the zinc layer is too thick, it is difficult to form a normal circuit since the zinc layer between the copper foil and the resist will be preferentially etched, and the copper layer will also be etched. Thus, the total amount of zinc is preferably 30 $\mu g/dm^2$ to 1000 $\mu g/dm^2$ based on metal zinc conversion.

Moreover, it is preferable that the amount of nickel contained in the nickel or nickel alloy layer of the rolled copper foil or electrolytic copper foil for an electronic circuit is 100 $\mu g/dm^2$ to 3000 $\mu g/dm^2$. This is an amount required for inhibiting the occurrence of sagging during the etching of the circuit and etching a uniform circuit, and it will be ineffective if the amount is less than 100 $\mu g/dm^2$. Preferably, the amount is 200 $\mu g/dm^2$ or more.

In addition, the upper limit is set to 3000 $\mu g/dm^2$. If the amount is excessive, the burden of removing the nickel or nickel alloy layer during the soft etching will become significant, and in certain cases it will cause treatment residue and impair the copper circuit design. Accordingly, the amount must be within the foregoing range.

Further, if the chromium layer or the chromate layer is to be provided in the rolled copper foil or electrolytic copper foil for an electronic circuit according to the present invention, the amount of chromium is set to be 100 $\mu g/dm^2$ or less based on metal chromium conversion. In addition, when forming the silane-treated layer, the amount of silane is preferably 20 $\mu g/dm^2$ or less based on silicon elemental conversion. This is in order to inhibit differences in the etching rate relative to the pattern etching solution.

Nevertheless, an adequate amount is effective in preventing the thermal oxidation of the nickel or nickel alloy layer.

The present invention is able to provide a method of forming an electronic circuit, the method of forming an electronic circuit by etching a copper foil of a copper-clad laminate comprising a rolled copper foil or electrolytic copper foil, wherein a layer of nickel or nickel alloy, which is a metal or an alloy with a lower etching rate than copper, is formed on the etching side of the copper foil, a heat resistance layer composed of zinc or zinc alloy or its oxide is formed on the nickel or nickel alloy layer, and thereafter the copper foil is subject to etching with an aqueous ferric chloride or an aqueous copper chloride to form a copper circuit.

Any of the foregoing etching solutions may be used, but in particular the aqueous ferric chloride is effective. This is because the etching of a fine circuit takes time, and the aqueous ferric chloride has a faster etching rate than the aqueous copper chloride.

The present invention is also able to provide a method of forming an electronic circuit, the method of forming an electronic circuit by etching a copper foil of a copper-clad laminate comprising a rolled copper foil or electrolytic copper foil, wherein the rolled copper foil or electrolytic copper foil for an electronic circuit according to any one of 1 to 9 above is subject to etching with an aqueous ferric chloride or an aqueous copper chloride to remove any unwanted portion of the copper and thereby form a copper circuit. In this method, both a rolled copper foil and an electrolytic copper foil for an electronic circuit can be used.

Examples of preferred plating conditions are shown below.
(Nickel Plating)
Ni: 10 to 40 g/L
pH: 2.5 to 3.5
Temperature: Ordinary temperature to 60° C.
Current density Dk: 2 to 50 A/dm$^2$
Time: 1 to 4 seconds
(Nickel-zinc alloy plating, part 1)
Here, a plated film basically in a metal or alloy state is basically obtained.
Ni: 5 to 40 g/L
Zn: 4 to 25 g/L
pH: 3 to 3.7
Temperature: Ordinary temperature to 60° C.
Current density Dk: 2 to 50 A/dm$^2$
Time: 1 to 4 seconds
(Nickel-Zinc Alloy Plating, Part 2)
Here, Zn is made of a zero-valent metallic state or a bivalent oxidized state (oxide or hydroxide), and the ratio of zinc in a zero-valent metallic state in the total zinc content of the nickel-zinc plating is 50% or less. Moreover, as a result of retaining this in a bath for 1 to 20 seconds after the plating, the chemical state (metal zinc/zinc oxide ratio) of Zn can be controlled.
Ni: 10 to 40 g/L
Zn: 0.5 to 7 g/L
H$_2$SO$_4$: 2 to 20 g/L
Temperature: Ordinary temperature to 60° C.
Current density Dk: 10 to 50 A/dm$^2$
Time: 1 to 4 seconds
(Nickel-Cobalt Alloy Plating)
Ni: 1 to 20 g/L
Co: 1 to 20 g/L
Temperature: Ordinary temperature to 60° C.
Current density Dk: 1 to 15 A/dm$^2$
Time: 1 to 10 seconds
(Nickel-Phosphorus Alloy Plating)
Ni: 50 to 100 g/L
P: 1 to 25 g/L
HBO$_3$: 0 to 30 g/L
pH: 0.5 to 2.5
Temperature: Ordinary temperature to 95° C.

Current density Dk: 5 to 40 A/dm$^2$
Time: 1 to 10 seconds
(Nickel-Molybdenum Alloy Plating)
Ni: 5 to 25 g/L
Mo: 0.01 to 5 g/L
Na$_2$P$_2$O$_7$: 160 g/L
pH: 8 to 9
Temperature: Ordinary temperature to 40° C.
Current density Dk: 1 to 5 A/dm$^2$
Time: 1 to 10 seconds
(Nickel-tungsten alloy plating)
Ni: 1 to 10 g/L
W: 20 to 50 g/L
Citric acid: 60 g/L
pH: 8 to 9
Temperature: Ordinary temperature to 50° C.
Current density Dk: 0.1 to 5 A/dm$^2$
Time: 1 to 10 seconds
(Zinc Plating)
Zn: 1 to 20 g/L
pH: 3 to 3.7
Temperature: Ordinary temperature to 60° C.
Current density Dk: 1 to 15 A/dm$^2$
Time: 1 to 10 seconds
(Zinc-Cobalt Alloy Plating)
Zn: 10 to 40 g/L
Co: 10 to 40 g/L
pH: 1 to 4
Temperature: Ordinary temperature to 60° C.
Current density Dk: 10 to 50 A/dm$^2$
Time: 1 to 4 seconds
(Zinc-Nickel Alloy Plating)
Zn: 0.1 to 30 g/L
Ni: 0.1 to 25 g/L
pH: 3 to 4
Temperature: 40 to 50° C.
Current density Dk: 0.5 to 5 A/dm$^2$
Time: 1 to 3 seconds
(Electroless Nickel-Boron Alloy Plating)
Nickel sulfate: 25 to 35 g/L
Dimethylamine-borane: 2 to 3 g/L
Glycolic acid: 25 to 35 g/L
Acetic acid: 15 g/L
pH: 6 to 7
Temperature: 50° C. to 70° C.
(Chromium Plating Conditions)
K$_2$Cr$_2$O$_7$ (Na$_2$Cr$_2$O$_7$ or CrO$_3$)
Cr: 40 to 300 g/L
H$_2$SO$_4$: 0.5 to 10.0 g/L
Bath temperature: 40 to 60° C.
Current density Dk: 0.01 to 50 A/dm$^2$
Time: 1 to 100 seconds
Anode: Pt—Ti plate, stainless steel plate, lead plate, etc.
(Chromate Treatment Conditions)

(a) Example of Electrolytic Chromate Treatment

CrO$_3$ or K$_2$Cr$_2$O$_7$: 1 to 12 g/L
Zn(OH)$_2$ or ZnSO$_4$.7H$_2$O: 0(0.05) to 10 g/L
Na$_2$SO$_4$: 0(0.05) to 20 g/L
pH: 2.5 to 12.5
Temperature: 20 to 60° C.
Current density: 0.5 to 5 A/dm$^2$
Time: 0.5 to 20 seconds
(Silane Treatment Conditions)
Silane is selected from the various systems shown below.
Concentration: 0.01 wt % to 5 wt %
Type: olefin-system silane, epoxy-system silane, acrylic-system silane, amino-system silane, mercapto-system silane
Silane dissolved in alcohol is diluted with water up to a prescribed concentration, and applied to the copper foil surface.

(Method of analyzing amount of nickel adhesion)

In order to analyze the nickel-treated surface, the opposite surface is prepared with FR-4 resin by press work, and subsequently masked. A sample thereof is dissolved in nitric acid with a concentration of 30% until the surface treatment coating is dissolved, the solution inside the beaker is diluted tenfold, and the quantitative analysis of nickel is performed with atomic absorption spectrometry.

(Method of Analyzing Amount of Zinc and Chromium Adhesion)

In order to analyze the treated surface, the opposite surface is prepared with FR-4 resin by press work, and subsequently masked. A sample thereof is boiled for 3 minutes in hydrochloric acid with a concentration of 10% to dissolve the treated layer, and this solution is used to perform the quantitative analysis of zinc and chromium with atomic absorption spectrometry.

Incidentally, since the total amount of zinc in the bilayer of the metal layer (A) with a low etching rate and the heat resistance layer (B) is defined, the analytical value with respect to zinc will equal the amount of zinc in the bilayer. Meanwhile, with respect to nickel, the amount of nickel contained in the nickel or nickel alloy layer (A) is defined. If the heat resistance layer (B) is zinc alloy that is free of nickel, the analytical value based on the analysis method will be the amount of nickel contained in the nickel or nickel alloy layer (A). Nevertheless, if the heat resistance layer (B) is zinc alloy that contains nickel, the amount of nickel contained in the nickel or nickel alloy layer (A) is calculated as follows in the present invention.

Figure 2:
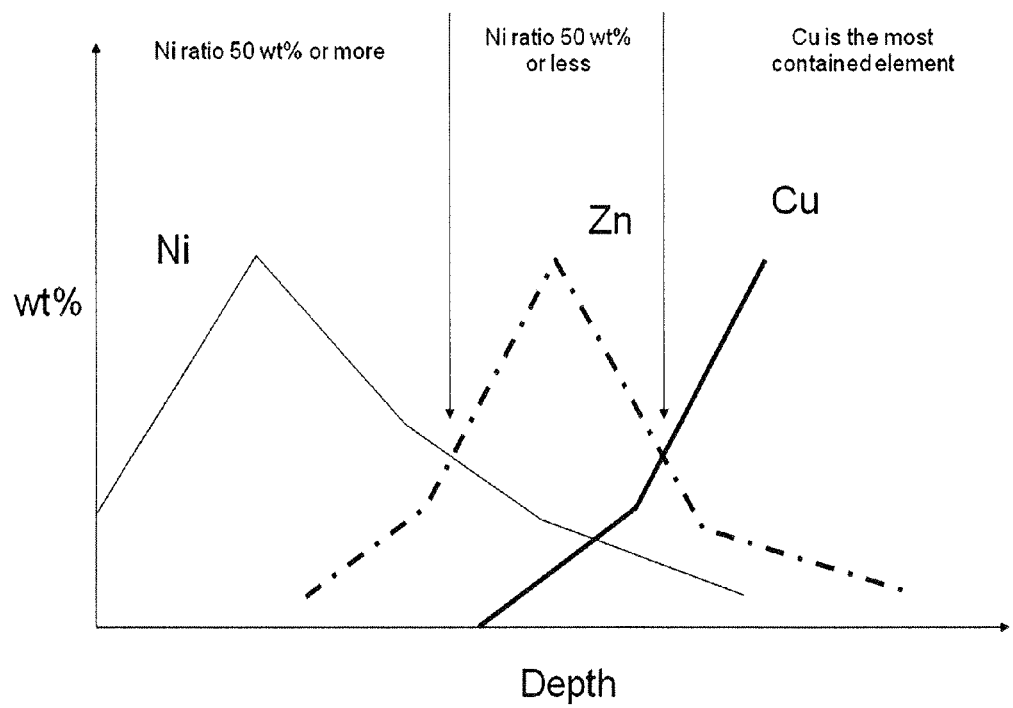
FIG. 2 A schematic diagram of the concentration profile of nickel, zinc, and copper measured in the depth direction.

In a concentration profile in the depth direction based on AXIS-HS manufactured by Kratos as a method of differentiating the metal layer (A) with a low etching rate and the heat resistance layer (B); for example, it is possible to understand that the nickel or nickel alloy layer (A) is outside and the heat resistance layer (B) is inside according to such information from the schematic diagram of the concentration profile shown in FIG. 2 that the max (peak) concentration of nickel is on the outer (surface) side and the max (peak) concentration of zinc is on the inner (copper) side. Moreover, the portion in which nickel among the elements excluding O and C exceeds 50 wt % is referred to as a nickel or nickel alloy layer (A), the portion in which nickel is 50 wt % or less is referred to as a heat resistance layer (B), and the portion from the location where copper becomes the most primary element is referred to as a base foil. The amount of nickel in the nickel or nickel alloy layer (A) is the amount in the portion from the outermost layer to where nickel exceeds 50 wt %, and the amount of nickel in the heat resistance layer (B) is the amount in the portion from where nickel falls below 50 wt % to where copper becomes the most primary element. The proportion of the amount of nickel in the bilayer is sought, and the amount of nickel in the nickel or nickel alloy layer (A) is calculated from the amount of nickel that is sought in the foregoing analysis.

(Consideration of Thermal Influence)

During the stage of producing the copper-clad laminate (CCL), the copper foil is exposed to heat. Due to this heat, the etching improvement treated layer provided to the copper foil surface will diffuse to the copper layer. Thus, the initially expected etching improvement effect will diminish, and the etching factor tends to decrease. In light of the above, in order to yield the same effect as a non-diffused state, it is necessary to increase the amount of adhesion of the improvement treated layer by 1.1 to 2 times in consideration of the heat quantity to which the copper foil is exposed during the production of the CCL.

When etching the copper foil of the copper-clad laminate, after forming a metal or alloy layer with a slower etching rate than copper on the etching side of the copper foil, the copper foil is etched using an aqueous copper chloride or an aqueous ferric chloride.

As a result of performing etching under the foregoing conditions, it is possible to achieve an etching factor of 2 or more; that is, it is possible to make the inclination angle between the etching side of the copper foil circuit and the resin substrate to be 63 degrees or more, preferably 70 degrees or more. A more preferable inclination angle is within the range of 80 to 90 degrees. It is thereby possible to form a rectangular etched circuit that is free from sagging.

(Soft Etching Properties)

Generally speaking, soft etching properties are examined by immersing the specimen in a solution of sulfuric acid-hydrogen peroxide mixing system for 2 minutes, and confirming the external appearance as to whether the plating has been removed. As an example of a soft etching solution, for instance, 165 g/L of sulfuric acid and 21 g/L of hydrogen peroxide are used. Under normal circumstances, soft etching is performed at 35° C. In the observation of the external appearance, complete removal is considered favorable, and any unremoved portions are considered inferior.

What is particularly noteworthy in soft etching is the case where the Ni alloy layer remains. If there is any residual Ni alloy layer, the plating properties may change. From this perspective, it is also necessary to pay attention to the soft etching properties.

EXAMPLES

The Examples and Comparative Examples of the present invention are now explained. Incidentally, these Examples are merely illustrative, and the present invention shall in no way be limited thereby. In other words, various modifications and other embodiments based on the technical spirit claimed in the claims shall be covered by the present invention as a matter of course.

Example 1

A rolled copper foil with a foil thickness of 18 µm was used. The surface roughness Rz of the rolled copper foil was 0.7 µm. Under the foregoing nickel plating conditions, a nickel plated layer of 1100 µg/dm$^2$ was formed on the rolled copper foil. Subsequently, under the foregoing zinc plating conditions, 200 µg/dm$^2$ of zinc as the heat resistance layer was formed thereon.

Moreover, the copper foil was bonded to a resin substrate with the adhesive surface opposite to the surface provided with the zinc plated layer and the nickel plated layer.

Subsequently, a circuit with 10 lines was printed with the process steps of resist coating and exposure, and etching treatment was further performed to remove any unwanted part of the copper foil. The etching conditions, circuit forming conditions, measurement conditions of the etching factor, and YAKE experiment were as follows.

(Etching Conditions)
Aqueous ferric chloride: (37 wt %, Baume degree: 40°)
Solution temperature: 50° C.
Spray pressure: 0.15 MPa (Circuit Forming Conditions)

Circuit pitch: There are two types of circuit pitches; namely, a 30 µm pitch and a 50 µm pitch, and the circuit pitch is changed according to the thickness of the copper foil. In the case of Example 1, the following conditions were adopted since a copper foil with a thickness of 18 µm was used.

(Formation of a Circuit with 50 µm Pitch)

Resist L/S=33 µm/17 µm; top (upper part) width of finished circuit: 15 µm; etching time: around 105 seconds (Measurement Conditions of Etching Factor)

In cases where etching is broadened downward (in cases where sagging occurs); if the intersection point of the perpendicular from the upper surface of the copper foil, on the assumption that the circuit was etched vertically, with the resin substrate is regarded as point P, and if the sagging length from the point P is regarded as distance "a", the etching factor shows the ratio (b/a) of the distance "a" to the thickness "b" of the copper foil. The larger the numerical value of the etching factor is, the greater the inclination angle will be. This means that etching residue will lessen and sagging will diminish.

The outline of the calculation method of the etching factor (EF) is shown in FIG. 1. As shown in FIG. 1, the calculation is performed as EF=b/a. As a result of using this etching factor, the quality of the etching properties can be easily determined.

(Yake Experiment)

Under ambient atmosphere, the copper foil was retained at 240° C. for 10 minutes to confirm the status of tarnish. These conditions are based on the assumption that the copper foil provided with a zinc plated layer and a nickel plated layer as the etching side is bonded to the resin substrate and a copper-clad laminate is formed thereby.

Etching was performed under the foregoing conditions. Consequently, etching proceeded almost vertically from the resist side of the side surface of the copper circuit toward the resin substrate side, and a rectangular copper foil circuit was formed. Subsequently, the inclination angle of the etched copper foil was measured (this measured value is the minimum value of the inclination angle in the circuit length of 100 µm).

Moreover, the etching factor and the oxidative discoloration (YAKE) of the nickel plated surface were examined. The foregoing results are shown in Table 1.

As shown in Table 1, the average value of the inclination angle of both sides was 73 degrees, and an approximately rectangular copper foil circuit was formed. The etching factor was 3.3 with the 50 µm pitch.

A favorable etched circuit was thereby obtained. In addition, no oxidative discoloration (YAKE) of the nickel plated surface was acknowledged. The reason for this is considered to be because the zinc plated layer formed on the nickel plated layer on the copper foil was able to prevent the oxidative discoloration of the nickel plated layer which is caused by the heating during the process of being bonded to the resin.

Moreover, the etching factor did not deteriorate due to the existence of the zinc plated layer, and this is worthy of special mention.

Example 2

An electrolytic copper foil with a foil thickness of 5 µm was used. The surface roughness Rz of the electrolytic copper foil was 3 µm. Under the foregoing nickel plating conditions, a nickel plated layer of 850 µg/dm$^2$ was formed on the gloss (S) surface of the electrolytic copper foil. Subsequently, under the foregoing zinc-cobalt alloy plating conditions, 700 µg/dm$^2$ of zinc as the heat resistance layer was formed thereon. The copper foil provided with the nickel plated layer and the zinc plated layer as the etching side was bonded to a resin substrate.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 30 μm Pitch)

In the case of Example 2, the following conditions were adopted since a copper foil with a thickness of 5 μm was used.

Resist L/S=25 μm/5 μm; top (upper part) width of finished circuit: 10 μm; etching time: around 48 seconds Etching was performed under the foregoing conditions. Consequently, etching proceeded almost vertically from the resist side of the side surface of the copper circuit toward the resin substrate side, and a rectangular copper foil circuit was formed. Subsequently, the inclination angle of the etched copper foil was measured (it is the minimum value of the inclination angle in the circuit length of 100 μm).

Moreover, the etching factor and the oxidative discoloration (YAKE) of the nickel plated surface were examined. The foregoing results are shown in Table 1.

As shown in Table 1, the average value of the inclination angle of both sides was 74 degrees, and an approximately rectangular copper foil circuit was formed. The etching factor was 3.5 with the 30 μm pitch.

A favorable etched circuit was thereby obtained. In addition, no oxidative discoloration (YAKE) of the nickel plated surface was acknowledged. The reason for this is considered to be because the zinc plated layer additionally formed on the nickel plated layer on the copper foil was able to prevent the oxidative discoloration of the nickel plated layer which is caused by the heating during the process of being bonded to the resin.

Moreover, as with Example 1, the etching factor did not deteriorate due to the existence of the zinc plated layer.

Example 3

A rolled copper foil of 9 μm was used. The surface roughness Rz of the rolled copper foil was 0.5 μm. Under the foregoing nickel-zinc alloy plating conditions (part 1), a plated layer was formed on the rolled copper foil surface. Subsequently, under the foregoing zinc-nickel alloy plating conditions, a heat resistance layer was formed thereon. Based on the proportion in the bilayer calculated from the analysis and the concentration profile in the depth direction, the amount of nickel in the nickel alloy layer (A) was 1100 μg/dm². Moreover, the total amount of zinc in the nickel alloy layer (A) and the heat resistance layer (B) was 320 μg/dm². The copper foil was bonded to a resin substrate with the adhesive surface opposite to the surface provided with the nickel plated layer and the zinc plated layer.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 30 μm Pitch)

Resist L/S=25 μm/5 μm; top (upper part) width of finished circuit: 10 μm; etching time: around 48 seconds Etching was performed under the foregoing conditions. Consequently, etching proceeded almost vertically from the resist side of the side surface of the copper circuit toward the resin substrate side, and a rectangular copper foil circuit was formed. Subsequently, the inclination angle of the etched copper foil was measured (it is the minimum value of the inclination angle in the circuit length of 100 μm).

Moreover, the etching factor and the oxidative discoloration (YAKE) of the nickel plated surface were examined. The foregoing results are shown in Table 1.

As shown in Table 1, the average value of the inclination angle of both sides was 72 degrees, and an approximately rectangular copper foil circuit was formed. The etching factor was 3.1 with the 30 μm pitch.

A favorable etched circuit was thereby obtained. In addition, no oxidative discoloration (YAKE) of the nickel plated surface was acknowledged. The reason for this is considered to be because the zinc plated layer additionally formed on the nickel plated layer on the copper foil was able to prevent the oxidative discoloration of the nickel plated layer which is caused by the heating during the process of being bonded to the resin.

Moreover, as with Example 1, the etching factor did not deteriorate due to the existence of the zinc plated layer.

Example 4

A rolled copper foil of 18 μm was used. The surface roughness Rz of the rolled copper foil was 0.7 μm. Under the foregoing nickel-zinc alloy plating conditions (part 2), a nickel plated layer containing 530 μg/dm² of nickel was formed on the rolled copper foil surface. Subsequently, under the foregoing zinc-chromate conditions, a heat resistance layer was formed thereon. Moreover, the total amount of zinc in the nickel alloy layer (A) and the heat resistance layer (B) was 120 μg/dm². The copper foil was bonded to a resin substrate with the adhesive surface opposite to the surface provided with the nickel plated layer and the zinc plated layer.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 50 μm Pitch)

Resist L/S=33 μm/17 μm; top (upper part) width of finished circuit: 15 μm; etching time: around 105 seconds Etching was performed under the foregoing conditions. Consequently, etching proceeded almost vertically from the resist side of the side surface of the copper circuit toward the resin substrate side, and a rectangular copper foil circuit was formed. Subsequently, the inclination angle of the etched copper foil was measured (it is the minimum value of the inclination angle in the circuit length of 100 μm).

Moreover, the etching factor and the oxidative discoloration (YAKE) of the nickel plated surface were examined. The foregoing results are shown in Table 1.

As shown in Table 1, the average value of the inclination angle of both sides was 72 degrees, and an approximately rectangular copper foil circuit was formed. The etching factor was 3.0 with the 50 μm pitch.

A favorable etched circuit was thereby obtained. In addition, no oxidative discoloration (YAKE) of the nickel plated surface was acknowledged. The reason for this is considered to be because the zinc plated layer additionally formed on the nickel plated layer on the copper foil was able to prevent the oxidative discoloration of the nickel plated layer which is caused by the heating during the process of being bonded to the resin.

Moreover, as with Example 1, the etching factor did not deteriorate due to the existence of the zinc plated layer.

Example 5 to Example 8

Subsequently, under the conditions shown in Table 1, using an electrolytic copper foil with a thickness of 5 μm in Example 5, a rolled copper foil with a thickness of 9 μm in Example 6, a rolled copper foil with a thickness of 18 μm in Example 7, and an electrolytic copper foil with a thickness of 5 μm in Example 8, various nickel alloy plating with a lower etching rate than copper and zinc plating as a heat resistance layer were performed. The nickel alloy plating and zinc plating were performed with the conditions shown above. The amount of nickel in the nickel alloy layer (A) and the total amount of zinc in the nickel alloy layer (A) and the heat resistance layer (B) are shown in Table 1. The conditions other than those shown in Table 1 were the same as Example 1.

Consequently, etching proceeded almost vertically from the resist side of the side surface of the copper circuit toward the resin substrate side, and a rectangular copper foil circuit was formed. Subsequently, the inclination angle of the etched copper foil was measured (it is the minimum value of the inclination angle in the circuit length of 100 μm). Moreover, the etching factor and the oxidative discoloration (YAKE) of the nickel plated surface were examined. The foregoing results are shown in Table 1.

As shown in Table 1, the average value of the inclination angle of both sides was 68 to 75 degrees, and an approximately rectangular copper foil circuit was formed. The etching factor was 2.7 to 3.7 with the 30 μm pitch, and 2.5 with the 50 μm pitch. A favorable etched circuit was thereby obtained.

In addition, no oxidative discoloration (YAKE) of the nickel alloy plated surface was acknowledged. The reason for this is considered to be because the zinc plated layer additionally formed on the nickel alloy plated layer was able to prevent the oxidative discoloration of the nickel plated layer which is caused by the heating during the process of being bonded to the resin. Moreover, as with Example 1, the etching factor did not deteriorate due to the existence of the zinc plated layer.

Incidentally, soft etching was performed and an observation was made about the plating residue in the foregoing Examples, but no residue was confirmed in any of the Examples, and favorable results were obtained.

Example 9 and Example 10

Under the conditions shown in Table 1, a rolled copper foil with a thickness of 18 μm was used in Example 9, and a rolled copper foil with a thickness of 9 μm was used in Example 10. The nickel alloy plating with a lower etching rate than copper and the zinc plating as a heat resistant layer as shown in Table 1 were performed. The nickel alloy plating and zinc plating were performed with the conditions shown above. The amount of nickel in the nickel alloy layer (A) and the total amount of zinc in the nickel alloy layer (A) and the heat resistance layer (B) are shown in Table 1. The conditions other than those shown in Table 1 were the same as Example 1.

Consequently, etching proceeded almost vertically from the resist side of the side surface of the copper circuit toward the resin substrate side, and a rectangular copper foil circuit was formed. Subsequently, the inclination angle of the etched copper foil was measured (it is the minimum value of the inclination angle in the circuit length of 100 μm). Moreover, the etching factor and the oxidative discoloration (YAKE) of the nickel plated surface were examined. The foregoing results are shown in Table 1.

As shown in Table 1, the average value of the inclination angle of both sides was 72 degrees in Example 9 and 71 degrees in Example 10, and an approximately rectangular copper foil circuit was formed. The etching factor was 3.1 with the 50 μm pitch in Example 9, and 2.9 with the 30 μm pitch in Example 10. A favorable etched circuit was thereby obtained.

In addition, no oxidative discoloration (YAKE) of the nickel alloy plated surface was acknowledged. The reason for this is considered to be because the zinc plated layer additionally formed on the nickel alloy plated layer was able to prevent the oxidative discoloration of the nickel plated layer which is caused by the heating during the process of being bonded to the resin. Moreover, as with Example 1, the etching factor did not deteriorate due to the existence of the zinc plated layer.

Incidentally, soft etching was performed and an observation was made about the plating residue in the foregoing Examples, but no residue was confirmed in any of the Examples, and favorable results were obtained.

Comparative Example 1

A rolled copper foil of 9 μm was used. Nickel plating was performed under the foregoing conditions. The surface roughness Rz of the rolled copper foil was 0.5 μm. A nickel plated layer of 550 μg/dm$^2$ was formed on the rolled copper foil under the foregoing plating conditions without performing zinc plating. Moreover, the copper foil was bonded to a resin substrate with the adhesive surface opposite to the surface provided with the nickel plated layer.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 30 μm Pitch)

Resist L/S=25 μm/5 μm; top (upper part) width of finished circuit: 10 μm; etching time: around 76 seconds Etching was performed under the foregoing conditions. Consequently, etching proceeded almost vertically from the resist side of the side surface of the copper circuit toward the resin substrate side, but a copper foil circuit was formed rather broader toward the end. Subsequently, the inclination angle of the etched copper foil was measured (it is the minimum value of the inclination angle in the circuit length of 100 μm).

Moreover, the etching factor and the oxidative discoloration (YAKE) of the nickel plated surface were examined. The foregoing results are shown in Table 1.

As shown in Table 1, the average value of the inclination angle of both sides was 68 degrees, and an approximately rectangular copper foil circuit was formed. The etching factor was 2.5 with the 30 μm pitch.

Consequently, a slightly favorable etched circuit was obtained. Nevertheless, oxidative discoloration (YAKE) of the nickel plated surface appeared considerably. This may result in defective etching properties in pattern etching, which is a subsequent treatment, or cause short circuits or defective circuit width.

Comparative Example 2

A rolled copper foil of 18 μm was used. The surface roughness Rz of the rolled copper foil was 0.7 μm. A zinc plated layer of 270 μg/dm$^2$ was formed on the rolled copper foil. Without forming a nickel plated layer, the copper foil, on which the zinc plated layer was formed, was bonded as the etching side to a resin substrate.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 50 μm Pitch)
Resist US=33 μm/17 μm; top (upper part) width of finished circuit: 15 μm; etching time: around 105 seconds Etching was performed under the foregoing conditions. Consequently, etching proceeded from the resist side of the side surface of the copper circuit toward the resin substrate side, but a copper foil circuit was formed broader toward the end. Subsequently, the inclination angle of the etched copper foil was measured (it is the minimum value of the inclination angle in the circuit length of 100 μm). Moreover, the etching factor and the oxidative discoloration (YAKE) of the copper foil were examined. The foregoing results are also shown in Table 1. As shown in Table 1, the average value of the inclination angle of both sides was 48 degrees, and a trapezoidal copper foil circuit with inferior etching properties was formed. The etching factor was 1.1 with the 50 μm pitch, and became inferior. Nevertheless, there was no oxidative discoloration (YAKE) of the copper foil surface.

Comparative Example 3

An electrolytic copper foil of 5 μm was used. The surface roughness Rz of the electrolytic copper foil was 3 μm. A zinc plated layer of 240 μg/dm$^2$ was formed on the gloss (S) surface of the electrolytic copper foil. Without forming a nickel plated layer thereon, the copper foil was bonded to a resin substrate with the adhesive surface opposite to the surface formed with the zinc plated layer.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 30 μm Pitch)
Resist L/S=25 μm/5 μm; top (upper part) width of finished circuit: 15 μm; etching time: around 48 seconds Etching was performed under the foregoing conditions. Consequently, etching proceeded from the resist side of the side surface of the copper circuit toward the resin substrate side, but a copper foil circuit was formed broader toward the end. Subsequently, the inclination angle of the etched copper foil was measured (it is the minimum value of the inclination angle in the circuit length of 100 μm). Moreover, the etching factor and the oxidative discoloration (YAKE) of the copper foil were examined. The foregoing results are also shown in Table 1. As shown in Table 1, the average value of the inclination angle of both sides was 54 degrees, and a trapezoidal copper foil circuit with inferior etching properties was formed. The etching factor was 1.4 with the 30 μm pitch, and became inferior. Nevertheless, there was no oxidative discoloration (YAKE) of the copper foil surface.

Comparative Example 4

A rolled copper foil of 9 μm was used. The surface roughness Rz of the rolled copper foil was 3 μm. A zinc plated layer containing 270 μg/dm$^2$ of zinc was formed on the rolled copper foil under the foregoing zinc-cobalt alloy plating conditions. Without forming a nickel plated layer thereon, the copper foil was bonded to a resin substrate with the adhesive surface opposite to the surface formed with the zinc plated layer.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 30 μm Pitch)
Resist L/S=25 μm/5 μm; top (upper part) width of finished circuit: 10 μm; etching time: around 76 seconds Etching was performed under the foregoing conditions. Consequently, etching proceeded from the resist side of the side surface of the copper circuit toward the resin substrate side, but a copper foil circuit was formed broader toward the end. Subsequently, the inclination angle of the etched copper foil was measured (it is the minimum value of the inclination angle in the circuit length of 100 μm). Moreover, the etching factor and the oxidative discoloration (YAKE) of the copper foil were examined. The foregoing results are also shown in Table 1. As shown in Table 1, the average value of the inclination angle of both sides was 59 degrees, and a trapezoidal copper foil circuit with inferior etching properties was formed. The etching factor was 1.8 with the 30 μm pitch, and became inferior. Nevertheless, there was no oxidative discoloration (YAKE) of the copper foil surface.

Comparative Example 5

A rolled copper foil of 18 μm was used. The surface roughness Rz of the rolled copper foil was 0.7 μm. A nickel plated layer of 500 μg/dm$^2$ was formed on the rolled copper foil, and a zinc plated layer of 20 μg/dm$^2$ was additionally formed thereon. The copper foil was bonded to a resin substrate with the adhesive surface opposite to the surface formed with the nickel plated layer and the zinc plated layer.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 50 μm Pitch)

Resist L/S=33 μm/17 μm; top (upper part) width of finished circuit: 15 μm; etching time: around 105 seconds Etching was performed under the foregoing conditions. Consequently, etching proceeded from the resist side of the side surface of the copper circuit toward the resin substrate side, but a copper foil circuit was formed broader toward the end. Subsequently, the inclination angle of the etched copper foil was measured (it is the minimum value of the inclination angle in the circuit length of 100 μm).

Moreover, the etching factor and the oxidative discoloration (YAKE) of the nickel plated surface were examined. The foregoing results are also shown in Table 1. As shown in Table 1, the average value of the inclination angle of both sides was 68 degrees, and an approximately rectangular copper foil circuit was formed. The etching factor was 2.5 with the 50 μm pitch.

Consequently, a slightly favorable etched circuit was obtained. Nevertheless, since the amount of zinc was small, oxidative discoloration (YAKE) of the nickel plated surface appeared considerably. This may result in defective etching properties in pattern etching, which is a subsequent treatment, or cause short circuits or defective circuit width.

Comparative Example 6

An electrolytic copper foil of 5 μm was used in Comparative Example 6. Under the foregoing nickel-zinc alloy plating conditions (part 1), a nickel plated layer containing 80 μg/dm$^2$ of nickel was formed on the electrolytic copper foil surface, and a zinc plated layer was additionally formed thereon. The total amount of zinc in the nickel alloy layer (A) and the heat resistance layer (B) was 100 μg/dm$^2$. The copper foil was bonded to a resin substrate with the adhesive surface opposite to the surface provided with the nickel plated layer and the zinc plated layer.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 30 μm Pitch)

Resist L/S=33 μm/17 μm; top (upper part) width of finished circuit: 15 μm; etching time: around 105 seconds Etching was performed under the foregoing conditions. Consequently, etching proceeded from the resist side of the side surface of the copper circuit toward the resin substrate side, but a copper foil circuit was formed broader toward the end. Subsequently, the inclination angle of the etched copper foil was measured (it is the minimum value of the inclination angle in the circuit length of 100 μm).

Moreover, the etching factor and the oxidative discoloration (YAKE) of the nickel plated surface were examined. The foregoing results are also shown in Table 1. As shown in Table 1, although there was no oxidative discoloration (YAKE) of the copper foil surface, the average value of the inclination angle of both sides was 58 degrees, and a trapezoidal copper foil circuit with inferior etching properties was formed. The etching factor was 1.6 with the 30 μm pitch, and became inferior.

The reason for this is considered to be the result of defective etching caused because the total amount of zinc was greater than the Ni amount. Thus, it is necessary to limit the amount of zinc moderately.

Comparative Example 7

A rolled copper foil with a film thickness of 9 μm was used in Comparative Example 7. A nickel plated layer of 1000 μg/dm$^2$ was formed on the rolled copper foil, and a zinc plated layer of 1500 μg/dm$^2$ was additionally formed thereon. The copper foil was bonded to a resin substrate with the adhesive surface opposite to the surface formed with the nickel plated layer and the zinc plated layer.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 50 μm Pitch)

Resist L/S=33 μm/17 μm; top (upper part) width of finished circuit: 15 μm; etching time: around 105 seconds Etching was performed under the foregoing conditions. Consequently, it was not possible to form a circuit by etching. Because the zinc layer was too thick, it was difficult to form a normal circuit since the zinc layer between the copper foil and the resist was preferentially etched, and the copper layer was also etched. Thus, it is necessary to limit the amount of zinc moderately.

Comparative Example 8

A rolled copper foil with a film thickness of 18 μm was used in Comparative Example 8. A nickel plated layer of 3500 μg/dm$^2$ was formed on the rolled copper foil, and a zinc plated layer of 100 μg/dm$^2$ was additionally formed thereon. The copper foil was bonded to a resin substrate with the adhesive surface opposite to the surface formed with the nickel plated layer and the zinc plated layer.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.

(Formation of a Circuit with 50 μm Pitch)

Resist L/S=33 μm/17 μm; top (upper part) width of finished circuit: 15 μm; etching time: around 105 seconds Etching was performed under the foregoing conditions. Consequently, etching proceeded from the resist side of the side surface of the copper circuit toward the resin substrate side. Subsequently, the inclination angle of the etched copper foil was measured (it is the minimum value of the inclination angle in the circuit length of 100 μm).

Moreover, the etching factor and the oxidative discoloration (YAKE) of the nickel plated surface were examined. The foregoing results are also shown in Table 1. As shown in Table 1, there was no oxidative discoloration (YAKE) of the copper foil surface, the average value of the inclination angle of both sides was 74 degrees, and etching factor was favorable at 3.6 with the 50 μm pitch.

Nevertheless, the soft etching properties deteriorated considerably. The reason for this has been confirmed as being the excessive amount of Ni. Thus, the amount of nickel must be limited moderately.

Comparative Example 9

An electrolytic copper foil of 5 μm was used in Comparative Example 9. A nickel-zinc alloy plated layer containing 300 μg/dm² of nickel was formed on the electrolytic copper foil surface, and a zinc plated layer was additionally formed thereon. The total amount of zinc in the nickel alloy layer (A) and the heat resistance layer (B) was 800 μg/dm². The copper foil was bonded to a resin substrate with the adhesive surface opposite to the surface provided with the nickel alloy plated layer and the zinc plated layer.

Subsequently, as with Example 1, a circuit with 10 lines was printed with the process steps of resist coating and exposure, and etching treatment was further performed to remove any unwanted part of the copper foil.

The etching conditions, measurement conditions of the etching factor, and YAKE experiment, but excluding the circuit forming conditions, were the same as Example 1. Thus, the description of conditions that overlap with Example 1 is omitted.
(Formation of a Circuit with 30 μm Pitch)
Resist L/S=33 μm/17 μm; top (upper part) width of finished circuit: 15 μm; etching time: around 105 seconds Etching was performed under the foregoing conditions. Consequently, etching proceeded broader from the resist side of the side surface of the copper circuit toward the resin substrate side. Subsequently, the inclination angle of the etched copper foil was measured (it is the minimum value of the inclination angle in the circuit length of 100 μm). Moreover, the etching factor and the oxidative discoloration (YAKE) of the nickel plated surface were examined.

The foregoing results are also shown in Table 1. As shown in Table 1, there was no oxidative discoloration (YAKE) of the copper foil surface, and the soft etching properties were favorable, but the average value of the inclination angle of both sides was 56 degrees, and the etching factor was inferior at 1.5 with the 30 μm pitch. The reason for this is considered to be that the nickel ratio in the nickel alloy layer (A) was low. Thus, it has been confirmed that the amount of nickel must be limited moderately.

As evident from Table 1, when comprising a nickel or nickel alloy layer with a lower etching rate than copper formed on the copper foil, and a heat resistance layer composed of zinc or zinc alloy or its oxide formed on the nickel or nickel alloy layer; it was able to form an approximately rectangular copper foil circuit with use of either the rolled copper foil or the electrolytic copper foil, and extremely favorable etched circuit was obtained.

Meanwhile, those that did not satisfy the conditions of the present invention caused considerable sagging, a trapezoidal copper foil circuit was formed, and this resulted in defective etching. In addition, YAKE occurred in cases where a zinc or zinc alloy layer was not provided.

In the Examples, it has been confirmed that the nickel layer and the nickel alloy layer are effective. In comparison to an alloy layer, the plating solution and plating conditions of an independent layer of nickel can be managaed easily.

TABLE 1

| | Base foil | Foil Thickness (μm) | Type of Metal Layer (B) | Type of Metal Layer (A) | Ni Content (μg/dm²) | Zn (μg/dm²) | Ni Ratio wt % | EF 30 μm pitch | EF 50 μm pitch | Inclination Angle (degrees) | Occurrence of YAKE | Soft Etching Properties |
|---|---|---|---|---|---|---|---|---|---|---|---|---|
| Example 1 | Rolled copper foil | 18 | A0 | B0 | 1100 | 200 | 85 | | 3.3 | 73 | None | ○ |
| Example 2 | Electrolytic copper foil | 5 | A0 | B1 | 850 | 700 | 88 | 3.5 | | 74 | None | ○ |
| Example 3 | Rolled copper foil | 9 | A1 | B2 | 1100 | 320 | 59 | 3.1 | | 72 | None | ○ |
| Example 4 | Rolled copper foil | 18 | A2 | B3 | 530 | 120 | 63 | | 3 | 72 | None | ○ |
| Example 5 | Electrolytic copper foil | 5 | A3 | B0 | 1500 | 1000 | 60 | 3.7 | | 75 | None | ○ |
| Example 6 | Rolled copper foil | 9 | A4 | B0 | 700 | 500 | 58 | 2.7 | | 70 | None | ○ |
| Example 7 | Rolled copper foil | 18 | A5 | B0 | 300 | 100 | 75 | | 2.5 | 68 | None | ○ |
| Example 8 | Electrolytic copper foil | 5 | A6 | B0 | 100 | 100 | 50 | 2.8 | | 70 | None | ○ |
| Example 9 | Rolled copper foil | 18 | A7 | B0 | 800 | 500 | 62 | | 3.1 | 72 | None | ○ |
| Example 10 | Rolled copper foil | 9 | A8 | B0 | 900 | 150 | 78 | 2.9 | | 71 | None | ○ |
| Comparative Example 1 | Rolled copper foil | 9 | A0 | | 550 | | 100 | 2.5 | | 68 | Occurred | ○ |
| Comparative Example 2 | Rolled copper foil | 18 | | B0 | 270 | 0 | | | 1.1 | 48 | None | ○ |
| Comparative Example 3 | Electrolytic copper foil | 5 | | B0 | 240 | 0 | | 1.4 | | 54 | None | ○ |

TABLE 1-continued

| | Base foil | Foil Thickness (μm) | Type of Metal Layer (B)* | Type of Metal Layer (A)* | Ni Content (μg/dm²) | Zn (μg/dm²) | Ni Ratio wt % | EF 30 μm pitch | EF 50 μm pitch | Inclination Angle (degrees) | Occurrence of YAKE | Soft Etching Properties |
|---|---|---|---|---|---|---|---|---|---|---|---|---|
| Comparative Example 4 | Rolled copper foil | 9 | | B1 | | 270 | 0 | 1.8 | | 59 | None | ○ |
| Comparative Example 5 | Rolled copper foil | 18 | A0 | B0 | 500 | 20 | 100 | | 2.5 | 68 | Occurred | ○ |
| Comparative Example 6 | Electrolytic copper foil | 5 | A1 | B0 | 80 | 100 | 88 | 1.6 | | 58 | None | ○ |
| Comparative Example 7 | Rolled copper foil | 9 | A0 | B0 | 1000 | 1500 | 100 | | | Circuit could not be formed | | |
| Comparative Example 8 | Rolled copper foil | 18 | A0 | B0 | 3500 | 100 | 100 | | 3.6 | 74 | None | X |
| Comparative Example 9 | Electrolytic copper foil | 5 | A1 | B0 | 300 | 800 | 45 | 1.5 | | 56 | None | ○ |

EF: Etching factor
*Type of metal layer (B)
B0 Zinc plating
B1 Zinc-cobalt alloy plating
B2 Zinc-nickel alloy plating
B3 Zinc-chromate
*Type of metal layer (A)
A0 Nickel plating
A1 Nickel-zinc alloy plating, part 1
A2 Nickel-zinc alloy plating, part 2
A3 Nickel-cobalt alloy plating
A4 Nickel-phosphorus alloy plating
A5 Nickel-molybdenum alloy plating
A6 Nickel-tungsten alloy plating
A7 Nickel-boron alloy plating
A8 Nickel-zinc-cobalt alloy plating The present invention yields the effect of being able to form a uniform circuit having the intended circuit width when forming a circuit by etching a copper foil, and yields the additional effects of being able to prevent sagging caused by the etching, shorten the time of forming a circuit by etching, make the thickness of the nickel or nickel alloy layer as thin as possible, facilitate the removal by soft etching, prevent the dissolution residue of the coating layer after etching, inhibit oxidation when exposed to heat, and prevent tarnish (discoloration) known as "YAKE". Since it is thereby possible to improve the etching properties in pattern etching and to prevent the occurrence of short circuits and defects in the circuit width, the present invention can be used as a copper-clad laminate (rigid or flexible), and also used for forming an electronic circuit of a printed substrate.

The invention claimed is:

1. A rolled copper foil or electrolytic copper foil for forming electronic circuits by etching, wherein the rolled copper foil or electrolytic copper foil comprises a nickel or nickel alloy layer (A) with a lower etching rate than copper formed on an etching side of the rolled copper foil or electrolytic copper foil, and a heat resistance layer (B) composed of at least one of zinc, zinc alloy and its oxide thereof, formed on the nickel or nickel alloy layer (A), wherein the rolled copper foil or electrolytic copper foil has a side that Is opposite of the etching side and that is bonded to a resin substrate.

2. The rolled copper foil or electrolytic copper foil according to claim 1, wherein the heat resistance layer (B) is a layer composed of zinc or zinc alloy, and the zinc alloy contains, as an alloy element, at least one or more types selected from nickel, cobalt and chromium.

3. The rolled copper foil or electrolytic copper foil according to claim 2, wherein the layer (A) with a lower etching rate than copper is nickel alloy, and a nickel ratio in the nickel alloy layer (A) exceeds 50 wt %.

4. The rolled copper foil or electrolytic copper foil according to claim 3, wherein the layer (A) with a lower etching rate than copper is nickel alloy, and an alloy component contained in the nickel alloy is zinc or cobalt.

5. The rolled copper foil or electrolytic copper foil according to claim 4, wherein a total amount of zinc contained in the heat resistance layer (B) and the nickel alloy layer (A) is 30 μg/dm² to 1000 μg/dm² based on metal zinc conversion and does not exceed a total amount of nickel.

6. The rolled copper foil or electrolytic copper foil according to claim 5, wherein the amount of nickel contained in the nickel or nickel alloy layer (A) is 100 μg/dm² to 3000 μg/dm².

7. The rolled copper foil or electrolytic copper foil according to claim 6, wherein the copper foil further comprises a chromium layer or a chromate layer or a silane-treated layer on the heat resistance layer (B).

8. The rolled copper foil or electrolytic copper foil according to claim 6, wherein the copper foil further comprises a chromium layer or a chromate layer on the heat resistance layer (B), and wherein an amount of chromium in the chromium layer or chromate layer is 100 μg/dm² or less based on metal chromium conversion.

9. The rolled copper foil or electrolytic copper foil according to claim 6, wherein the copper foil further comprises a silane-treated layer on the heat resistance layer (B), and wherein the amount of silane in the silane-treated layer is 20 μg/dm² or less based on silicon elemental conversion.

10. The rolled copper foil or electrolytic copper foil according to claim 1, wherein the layer (A) with a lower etching rate than copper is nickel alloy, and a nickel ratio in the nickel alloy layer (A) exceeds 50 wt %.

11. The rolled copper foil or electrolytic copper foil according to claim 1, wherein the layer (A) with a lower etching rate than copper is nickel alloy, and an alloy component contained in the nickel alloy is zinc, zinc oxide, zinc hydroxide or cobalt.

12. The rolled copper foil or electrolytic copper foil according to claim 1, wherein a total amount of zinc contained in the heat resistance layer (B) and the nickel alloy layer (A) is 30 μg/dm$^2$ to 1000 μg/dm$^2$ based on metal zinc conversion and does not exceed a total amount of nickel contained in the heat resistance layer (B) and the nickel alloy layer (A).

13. The rolled copper foil or electrolytic copper foil according to claim 1, wherein an amount of nickel contained in the nickel or nickel alloy layer (A) is 100 μg/dm$^2$ to 3000 μg/dm$^2$.

14. The rolled copper foil or electrolytic copper foil according to claim 1, wherein the copper foil further comprises at least one of a chromium layer, a chromate layer and a silane-treated layer on the heat resistance layer (B).

15. The rolled copper foil or electrolytic copper foil according to claim 1, wherein the copper foil further comprises a chromium layer or a chromate layer on the heat resistance layer (B), and wherein an amount of chromium in the chromium layer or chromate layer is 100 μg/dm$^2$ or less based on metal chromium conversion.

16. The rolled copper foil or electrolytic copper foil according to claim 1, wherein the copper foil further comprises a silane-treated layer on the heat resistance layer (B), and wherein the amount of silane in the silane-treated layer is 20 μg/dm$^2$ or less based on silicon elemental conversion.

17. A copper clad laminate, comprising:
- a copper foil having opposed faces including a bonding face and an etching side face opposite said bonding face;
- a resin substrate bonded to said bonding face of said copper foil;
- a nickel or nickel alloy layer on said etching side face of said copper foil, said nickel or nickel alloy layer having an etching rate which is lower than that of copper; and
- a heat resistance layer of zinc, zinc alloy, or oxide thereof on said nickel or nickel alloy layer such that said nickel or nickel alloy layer is sandwiched between said etching side face of said copper foil and said heat resistance layer;
- said nickel or nickel alloy layer and said heat resistance layer forming a bi-layer structure on said etching side face of said copper foil.

18. A copper clad laminate according to claim 17, further comprising a chromium or chromate layer on said heat resistance layer.

19. A copper clad laminate according to claim 18, further comprising a silane-treated layer on said chromium or chromate layer.

* * * * *